(12) United States Patent
Gardner et al.

(10) Patent No.: US 7,305,055 B1
(45) Date of Patent: Dec. 4, 2007

(54) SEARCH-EFFICIENT MIMO TRELLIS DECODER

(75) Inventors: James Gardner, San Ramon, CA (US); Vincent Knowles Jones, Redwood City, CA (US); Didier Johannes Richard van Nee, De Meern (NL); Geert Arnaut Awater, Utrecht (NL)

(73) Assignee: Qualcomm Incorporated, San Diego, CA (US)

( * ) Notice: Subject to any disclaimer, the term of this patent is extended or adjusted under 35 U.S.C. 154(b) by 664 days.

(21) Appl. No.: 10/643,774

(22) Filed: Aug. 18, 2003

(51) Int. Cl.
*H04B 7/10* (2006.01)
(52) U.S. Cl. ............... 375/347; 375/260; 375/262; 375/267; 375/299; 375/341; 455/101; 704/242; 714/795
(58) Field of Classification Search ............ 375/242, 375/260, 267, 358, 340, 347; 380/274; 370/252, 370/347, 208, 203, 330, 335; 455/101, 427
See application file for complete search history.

(56) References Cited

U.S. PATENT DOCUMENTS 4,891,823 A * 1/1990 Cole ................... 375/242
6,473,467 B1 * 10/2002 Wallace et al. ......... 375/267

OTHER PUBLICATIONS

Ungerboeck, "Trellis-Coded Modulation with Redundant Signal Sets Part I," IEEE Communications Magazine, vol. 25, No. 2, Feb. 1987.
Ungerboeck, "Trellis-Coded Modulation with Redundant Signal Sets Part II," IEEE Communications Magazine, vol. 25, No. 2, Feb. 1987.
Viterbi, "Error Bounds for Convolutional Codes and an Asymptotically Optimum Decoding Algorithm," IEEE Trans. on Information Theory, vol. IT-13, No. 2, Apr. 1967.
G. D. Forney, Jr., "Maximum-Likelihood Sequence Detection in the Presence of Intersymbol Interference," IEEE Trans. on Information Theory, vol. IT-18, No. 3, pp. 363-378, May 1972.
G. D. Forney, Jr., "The Viterbi Algorithm," IEEE Proceedings, vol. 61, pp. 268-278, No. 3, Mar. 1973.

* cited by examiner

*Primary Examiner*—David Payne
*Assistant Examiner*—Adolf DSouza
(74) *Attorney, Agent, or Firm*—Amin, Turocy & Calvin, LLP

(57) ABSTRACT

A decoder generates distance and label metrics associated with each label of a coset transmitted in a multi-input multi-output communication system having $M_t$ transmit antennas and $M_r$ receive antennas by performing $2^{(u+n)(M_t-1)}$ searches, where n is the number of encoded bits used to identify one of $2^n$ cosets at the transmitting end and u is the number of unencoded bits used to select one of $2^u$ labels at the transmitting end. The decoder forms an intermediate vector quantity associated with one of the transmit antennas to compute the metrics associated with each of the remaining transmit antennas. The decoder then forms a second intermediate vector quantity to compute the metrics associated with the transmit antenna that was used to form the first intermediate variable. The metrics so computed are used by a Viterbi decoder to identify the coset and the most likely transmitted label in that coset.

20 Claims, 1 Drawing Sheet

SEARCH-EFFICIENT MIMO TRELLIS DECODER

BACKGROUND OF THE INVENTION

The present invention relates to digital communication, and more particularly to trellis coding used with multiple-input multiple output communication systems.

Demand for wireless digital communication and data processing systems is on the rise. Inherent in most digital communication channels are errors introduced when transferring frames, packets or cells containing data. Such errors are often caused by electrical interference or thermal noise. Data transmission error rates depend, in part, on the medium which carries the data. Typical bit error rates for copper based data transmission systems are in the order of $10^{-6}$. Optical fibers have typical bit error rates of $10^{-9}$ or less. Wireless transmission systems, on the other hand, may have error rates of $10^{-3}$ or higher. The relatively high bit error rates of wireless transmission systems pose certain difficulties in encoding and decoding of data transmitted via such systems. Partly because of its mathematical tractability and partly because of its application to a broad class of physical communication channels, the additive white Gaussian noise (AWGN) model is often used to characterize the noise in most communication channels.

Data is often encoded at the transmitter, in a controlled manner, to include redundancy. The redundancy is subsequently used by the receiver to overcome the noise and interference introduced in the data while being transmitted through the channel. For example, the transmitter might encode k bits with n bits where n is greater than k, according to some coding scheme. The amount of redundancy introduced by the encoding of the data is determined by the ratio n/k, the inverse of which is referred to as the code rate. Codewords representing the n-bit sequences are generated by an encoder and delivered to a modulator that interfaces with the communication channel. The modulator maps each received sequence into a symbol. In M-ary signaling, the modulator maps each n-bit sequence into one of $M=2^n$ symbols. Data in other than binary form might be encoded, but typically data is representable by a binary digit sequence.

To gain bandwidth efficiency and coding, Trellis Coded Modulation (TCM) has been developed and combines a multilevel phase modulation signaling set with a trellis coding scheme. TCM increases the minimum Euclidean distance between pairs of coded signals to reduce the loss from the expansion of signal set and to achieve coding gain with relatively relatively simple codes. The TCM is described, e.g., in Ungerboeck, "Trellis-Coded Modulation with Redundant Signal Sets Part I," IEEE Communications Magazine, Vol. 25, February 1987; and in Ungerboeck, "Trellis-Coded Modulation with Redundant Signal Sets Part II," IEEE Communications Magazine, Vol. 25, February 1987, both of which are incorporated herein by reference for all purposes.

At the receiving end of a transmission channel, the coded symbols must be decoded. The Viterbi algorithm is an efficient maximum-likelihood sequence detection method for decoding convolutional and trellis coded symbols transmitted over AWGN channels. The Viterbi algorithm is described in a number of publications. See for example, Viterbi, "Error Bounds for Convolutional Codes and an Asymptotically Optimum Decoding Algorithm", IEEE Trans. on Information Theory, Vol. IT-13, April 1967; G. D. Formey, Jr., "Maximum-Likelihood Sequence Detection in the Presence of Intersymbol Interference" IEEE Trans. on Information Theory, Vol. IT-18, pp. 363-378, May 1972; and G. D. Formey, Jr., "The Viterbi Algorithm", IEEE Proceedings, Vol. 61, pp. 268-278, March 1973, all of which are incorporated herein by reference for all purposes.

In accordance with the Viterbi algorithm, for each received signal, a distance between that signal at time $t_i$ and all the trellis paths entering each state at time $t_i$ is calculated. In the Viterbi algorithm, the minimum Euclidean distance is selected as the optimum branch metric for decoding convolutional and trellis sequences transmitted in AWGN channels.

To increase the data rate and the operating range without increasing the bandwidth, multiple input multiple output (MIMO) systems have been developed. In a MIMO system, the transmitter includes multiple transmit antennas and the receiver includes multiple receive antennas. The transmitter splits the data to be transmitted into a number of streams (typically bit streams) and transmits the streams via the multiple transmit antennas. The receiver receives the transmitted streams via the multiple receive antennas. The labeling convention used herein for alphanumeric symbols represents scaler quantities as italic symbols, vectors as lowercase bold symbols, and matrices as uppercase bold symbols. Unless otherwise indicated, it is understood that each scaler quantity, vector component or matrix element can be a complex number.

FIG. 1 is a simplified block diagram of a prior art MIMO TCM encoder 10. TCM encoder 10 includes a serial-to-parallel converter 12, a convolutional encoder 14, a symbol mapper 16 and a serial-to-parallel converter 18. The MIMO system (not shown) of which MIMO TCM encoder 10 is a part, includes $M_t$ transmit antennas and $M_r$ receive antennas (not shown). The channel through which the data encoded by TCM encoder 10 is transmitted is characterized by the complex matrix H having the dimensions of $M_r \times M_t$. The channel is assumed to be an AWGN channel. Convolutional encoder 14 in conjunction with symbol mapper 14 perform the TCM encoding.

Unencoded data bit streams arrive at serial-to-parallel converter 12 (hereinbelow referred to alternatively as converter 12). Out of every u+k bits that serially arrive at converter 12, u bits are delivered in parallel to symbol mapper 16 and k bits are delivered in parallel to convolutional encoder 14. The k-bits are encoded by convolutional encoder 14 which has a code rate of k/n. Symbol mapper 16 uses the n encoded bits to select one of $2^n$ cosets of symbols, each having $2^u$ labels. Symbol mapper 16 then uses the u unencoded bits to select one of the $2^u$ labels from the selected coset. Each label so selected is a complex number having a real and an imaginary component. Serial-to-parallel converter 18 converts the serial bit streams associated with each selected label to $M_t$ parallel bits, which are transmitted by the corresponding $M_t$ transmit antennas. Accordingly, each transmitted vector y has $M_t$ complex components. Each received vector r has the dimension Of $M_r$ and is represented by the following expression:

$$r = Hy + v$$

where v is the noise and/or interference vector which is assumed to have a spatial auto-covariance matrix.

FIG. 2 is a simplified block diagram of a prior art MIMO TCM decoder 30 that is adapted to decode the data encoded by TCM encoder 10 after this data is transmitted. MIMO TCM decoder 30 includes a Logarithmic Maximum A Posteriori (Log-MAP) decoder 30, a Viterbi trellis decoder 34, a selector 36 and a parallel-to-serial converter 38.

Log-MAP decoder 32 is supplied with the received vector r and the channel matrix H and, in response, generates an estimate for each of the transmitted symbols; this estimate is also referred to as a soft decision of the decoded symbol. In particular, Log-MAP decoder 32 finds the Euclidean distance between the received vector r and the nearest label in each coset for one antenna by searching over all other possible transmitted labels on the other $M_t-1$ antennas and does this for each antenna. For each coset j, for all possible labels in coset j and for each transmit antenna i, Log-MAP decoder 32 computes a distance metric d(i, j) and a corresponding label metric label(i, j), as shown below:

$$d(i, j) = \min_k (r - HX(k))'' \Lambda^{-1}(r - HX(k)) \quad (1)$$

$$\text{label}(i, j) = \text{argmin}(r - HX(k))'' \Lambda^{-1}(r - HX(k)) \quad (2)$$

In the above equations (1) and (2):

H: is the channel estimate matrix, $\Lambda^{-1}$: is the inverse of the auto-covariance matrix of any of the antennas, X: is a $M_t$ by CL matrix of the possible transmitted symbol combinations on all the $M_t$ antennas, where $C=2^n$ is the number of cosets, and $L=2^u$ is the number of labels in each coset.

X(k): represents all rows of matrix X that have an element of coset k in their ith column.

Metrics d(i, j) and label(i, j) so computed are supplied to Viterbi (trellis) decoder 34 and selector 36, respectively. Viterbi decoder 34 assigns the same distance d(i,j) to all edges in the trellis that generate an output with elements from coset j. The metrics d(i,j) and label(i,j) corresponding to each transmit antenna i are applied to associated transitions of the trellis. For instance, the distance and label metrics associated with transmit antenna 1 are applied to the following transitions in the trellis:

0, $M_t$, 2$M_t$, . . . .

Similarly, the distances and label metrics associated with transmit antenna 2 are applied to the following transitions in the trellis:

1, $M_t$+1, 2 $M_t$+1, . . . .

Viterbi decoder 34 identifies the most likely k unencoded bits received by converter 12 (see FIG. 1) and the corresponding coset for each channel instance. The most likely coset returned from Viterbi decoder 34 is supplied to selector 36. Using the cosets received from Viterbi decoder 34, selector 36 identifies the most likely u unencoded bits and the corresponding labels for each channel instance. Parallel-to-serial converter 38 receives the bit streams associated with the cosets and labels in parallel—as identified by Viterbi decoder 34 and selector 36—and serializes these bit streams at its output terminals.

Prior art decoder 30 performs $p=2^{(u+n)*Mt}$ searches to identify the transmitted symbols at the receiving end. As the number of constellation signals (i.e., the symbol set) increases, the number of searches required to identify the transmitted symbols increases by a large factor. It would be desirable to have a decoder adapted to perform fewer searches to identify the transmitted symbols than conventional decoders.

BRIEF SUMMARY OF THE INVENTION

In accordance with the present invention, a decoder generates one or more metrics associated with each symbol of a symbol coset transmitted in a multi-input multi-output communication system having $M_t$ transmit antennas and $M_r$ receive antennas by performing on the order of $2^{(u+n)(Mt-1)}$ searches, where n is the number of encoded bits used to select one of $2^n$ cosets at the transmitting end and u is the number of unencoded bits used to select one of $2^u$ symbols at the transmitting end, for each of the $M_t$ antennas. The metrics are subsequently used by a Viterbi decoder to identify the coset and their corresponding transmitted symbols.

To perform the above search, the decoder receives vector r of the received symbols—received on the $M_r$ receive antennas—and a channel matrix H having $M_t$ columns and $M_r$ rows to characterize the channel between the $M_t$ transmit antennas and the $M_v$ receive antennas. Next, the decoder forms a vector quantity $xopt_1$ representing an optimized guess for the symbol transmitted by a first one of the transmit antennas and whose elements are defined by a combination of a first column $h_1$ of matrix H, the remaining columns $H_{n\neq1}$ of matrix H and a matrix X of possible symbols transmitted on the remaining transmit antennas. Matrix X thus includes ($M_t$-1) rows and $2^{u+n}$ columns. The decoder then uses the vector quantity $xopt_1$ to compute a distance metric and a label metric associated with each of the remaining transmit antennas. Next, the decoder forms another vector quantity $xopt_2$ representing another optimized guess associated with a second one of the transmit antennas. Accordingly, vector quantity $xopt_2$ includes elements defined by a combination of a second column $h_2$ of matrix H, the remaining columns $H_{n\neq2}$ of matrix H, and matrix X. The decoder uses the vector quantity $xopt_2$ to compute a distance metric and a label metric associated with the first transmit antenna. The first and second antennas could be any pair of transmit antennas.

In one embodiment, the vector quantities $xopt_1$ and $xopt_2$ are computed using the following equations:

$$xopt_1 = \left[ \frac{\Lambda^{-1}(h_1^* r - h_1^* H_{n\neq1} X)}{h_1^* h_1} \right]$$

$$xopt_2 = \left[ \frac{\Lambda^{-1}(h_2^* r - h_2^* H_{n\neq2} X)}{h_2^* h_2} \right]$$

where vector $h_1^*$ is the complex conjugate transpose of vector $h_1$, and vector $h_2^*$ is the complex conjugate transpose of vector $h_2$. The distance metric associated with each, except the first, transmit antenna is computed using the following equation:

$$d(i, j) = \min_k (r - h_1 xopt_1(k) - H_{n\neq1} X(k))'' \Lambda^{-1}(r - h_1 xopt_1(k) - H_{n\neq1} X(k))$$

where $h_1$ is the 1$^{st}$ column of Matrix H, $H_{n\neq1}$ are all but the remaining columns of matrix H, $\Lambda^{-1}$ is the auto-covariance of any of the transmit antennas, X(k) represents all rows of matrix X which have an element of coset k in their $i^{th}$ column, and $xopt_1(k)$ represents those elements of vector $xopt_1$ that belong to coset k. The label metric associated with each, except the first, transmit antenna is computed using the following equation:

$$label(i, j) = \operatorname*{argmin}_{k}(r - h_1 xopt_1(k) - H_{n \neq 1} X(k))'' \Lambda^{-1}(r - h_1 xopt_1(k) - H_{n \neq 1} X(k))$$

The distance and label metrics associated with the first transmit antenna are respectively obtained using the following equations:

$$d(i, j) = \min_{k}(r - h_2 xopt_2(k) - H_{n \neq 2} X(k))'' \Lambda^{-1}(r - h_2 xopt_2(k) - H_{n \neq 2} X(k))$$

$$label(i, j) = \operatorname*{argmin}_{k}(r - h_2 xopt_2(k) - H_{n \neq 2} X(k))'' \Lambda^{-1}(r - h_2 xopt_2(k) - H_{n \neq 2} X(k))$$

The decoder then supplies the distance and label metrics associated with each transmit antenna to a Viterbi decoder which, in response, identifies the received symbols.

DETAILED DESCRIPTION OF THE INVENTION

Figure 1:
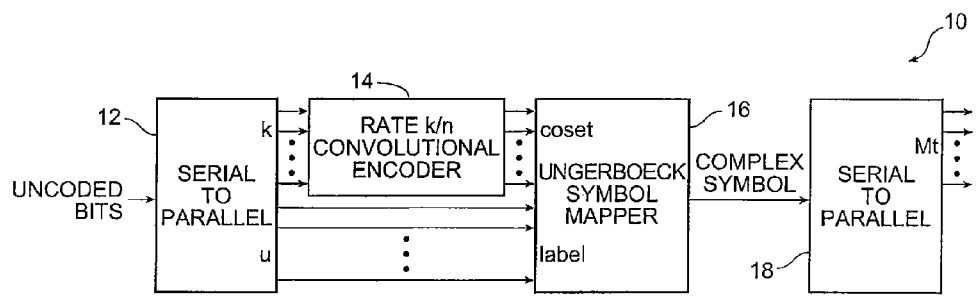
FIG. 1 is a simplified block diagram of a MIMO TCM encoder, as known in the prior art.
Figure 2:
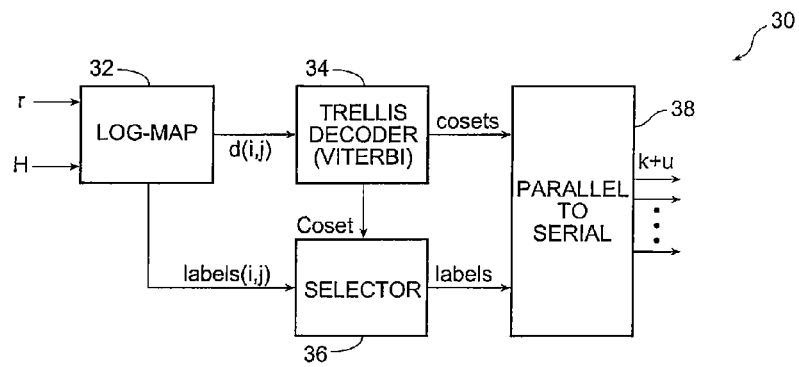
FIG. 2 is a simplified block diagram of a MIMO TCM decoder, as known in the prior art.
Figure 3:
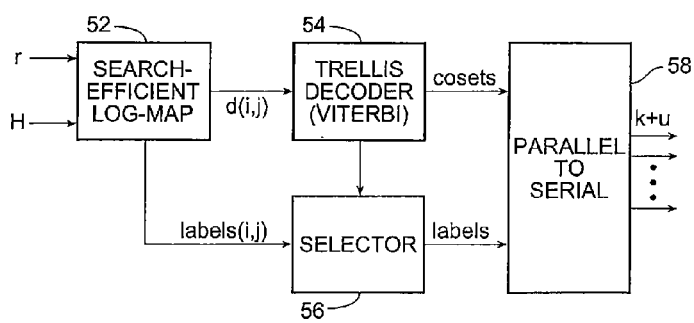
FIG. 3 is a simplified block diagram of a MIMO TCM decoder including a search-efficient Log-MAP decoder, in accordance with one embodiment of the present invention.

FIG. 3 is a simplified block diagram of a MIMO TCM decoder 50, in accordance with one embodiment of the present invention. MIMO TCM decoder 50 includes, in part, a search-efficient Log-MAP decoder 52, a Viterbi decoder 54, a selector 56 and a parallel-to-serial converter 58. MIMO TCM decoder 50 is adapted to decode symbols encoded via, for example, the prior art encoder shown in FIG. 1, and transmitted via a channel with a characteristic estimate matrix H.

At the transmitting end (not shown), out of every u+k bits, k-bits are encoded by a convolutional encoder that has a code rate of k/n. The n encoded bits are used to select one of $2^n$ cosets, each having two $2^u$ labels. The u unencoded bits are subsequently used to select one of the $2^u$ labels from the selected coset. Each label so selected is a complex number having a real and an imaginary component. The serial bit stream associated with each selected label is converted to $M_t$ parallel bits, and is subsequently transmitted by the corresponding $M_t$ transmit antennas.

In the following, it is assumed that encoded data are transmitted on $M_t$ transmit antennas and are received on $M_r$ receive antennas. Therefore, each transmitted symbol vector y has $M_t$ complex components. It is further assumed that each received vector symbol r has the dimension of $M_r$ and is represented by the following expression:

$$r = Hy + v$$

where v is the noise and/or interference vector which is assumed to have a spatial auto-covariance matrix.

In accordance with the present invention, search-efficient Log-MAP decoder 52 performs $p = 2^{(u+n)*(Mt-1)}$ searches to determine a distance metric (alternatively referred to hereinbelow as a distance) and a label metric (alternatively referred to hereinbelow as a label) associated with each transmitted symbol. The search results are subsequently supplied to Viterbi decoder 54 and selector 56, as part of the label decoding process. For each transmit antenna, a set of associated distances and labels are computed for each $m^{th}$ channel instance given the channel estimates H(m) (alternatively referred to hereinbelow as H) and the received vector r(m) (alternatively referred to hereinbelow as r). A channel instance is associated with one of the $M_t$ transmit antennas and one of the $M_r$ receive antennas, so the $M_{th}$ channel instance is one of $M_t \times M_r$ channel instances. To make this computation for each transmit antenna, the effects of the other $M_t - 1$ antennas are first removed, as described further below.

First, one of the transmit antennas (e.g., the first transmit antenna) is selected from the linear array of $M_t$ transmit antennas, to form an associated intermediate vector quantity. It is understood that any one of the $M_t$ transmit antennas could be selected as the first transmit antenna. An associated intermediate vector quantity $xopt_1$ is computed for the first transmit antenna as follows:

$$xopt_1 = \left[ \frac{\Lambda^{-1}(h_1^* r - h_1^* H_{n \neq 1} X)}{h_1^* h_1} \right]$$

where:
$h_1$ is the first column of channel estimate matrix H,
$H_{n \neq 1}$: are the remaining columns of H,
$\Lambda^{-1}$: is the inverse of the auto-covariance matrix of any of the transmit antennas,
X: is a $(M_t - 1)$ by CL matrix of the p possible transmitted symbol combinations on the $M_t - 1$ other antennas, where $C = 2^n$ is the number of cosets, and $L = 2^u$ is the number of labels in each coset.

It is understood that any one of the $M_t$ transmit antennas may be selected to form the intermediate variable, as described above. Therefore, it is understood that the selection of the first transmit antenna to form the intermediate variable $xopt_1$, in accordance with the above, does not imply a constraint to some canonicalization of physical antennas.

The distance between the received vector r and the nearest label in each coset is determined for each antenna by searching over all other possible transmit symbols sets on the other $M_t - 2$ antennas with $xopt_1$ representing the most likely sequence transmitted on the first antenna. In other words, for each transmit antenna i (i is an integer varying from 1 to $M_t$), except the first transmit antenna (i.e., i=1) for all L possible labels in each coset j, a distance d(i, j) is calculated as shown below:

$$d(i, j) = \min_{k}(r - h_1 xopt_1(k) - H_{n \neq 1} X(k))'' \Lambda^{-1}(r - h_1 xopt_1(k) - H_{n \neq 1} X(k))$$

where:
X(k) represents all rows of matrix X which have an element of coset k in their $i^{th}$ column,
$xopt_1(k)$: represents those elements of vector $xopt_1$ that belong to coset k.

Edges in the trellis that generate an output with elements from coset j, can be assigned the same distance d(i, j). The distances are computed for each of the other transmit antennas, i=2, ... $M_t$. Next, using the channel estimates H and r, the corresponding labels are computed for each edge in the trellis decoder, as shown below:

$$\text{label}(i, j) = \underset{k}{\operatorname{argmin}}(r - h_1 xopt_1(k) - H_{n \neq 1} X(k))'' \Lambda^{-1} (r - h_1 xopt_1(k) - H_{n \neq 1} X(k))$$

Following the computation of the distance metrics d(i,j) for all possible labels L in each coset j for each antenna i≠1 and after the corresponding labels label(i,j) are determined for each antenna i≠1, the distance metric associated with the first antenna is determined by removing the effects of another antenna (e.g., i=2) and repeating the above computations. In other words, after distance metrics d(i,j) and label metrics label(i,j) are determined for each antenna i≠1 for all L possible labels in each coset j, the following vector quantity is calculated:

$$xopt_2 = \begin{bmatrix} \dfrac{\Lambda^{-1}(h_2^* r - h_2^* H_{n \neq 2} X)}{h_2^* h_2} \end{bmatrix}$$

Vector quantity $xopt_2$ is subsequently used in computing the distances and labels associated with the first antenna and coset j, as shown below:

$$d(1, j) = \underset{k}{\min}(r - h_2 xopt_2(k) - H_{n \neq 2} X(k))^H \Lambda^{-1} (r - h_2 xopt_2(k) - H_{n \neq 2} X(k))$$

$$\text{label}(1, j) = \underset{k}{\operatorname{argmin}}(r - h_2 xopt_2(k) - H_{n \neq 2} X(k))^H \Lambda^{-1} (r - h_2 xopt_2(k) - H_{n \neq 2} X(k))$$

The distances d(i,j) and labels label(i,j) corresponding to each transmit antenna are applied to associated transitions of the trellis. For instance, the distances and labels associated with the first transmit antenna (i.e., i=1) are applied to the following trellis transitions:

0, $M_t$, 2 $M_t$ . . .

Similarly, the distances and labels associated with the second transmit antenna (i.e., i=2) are applied to the following trellis transitions:

1, $M_t$+1, 2 $M_t$+1, . . .

Viterbi decoder 54 receives the distances d(i,j) and labels label(i,j) generated by search-efficient Log-MAP 52. In response, Viterbi decoder 54 identifies the most likely transmitted coset. Using the cosets identified by Viterbi decoder 54 and the labels generated by search-efficient LOG-MAP 52, selector 54 selects the transmitted label belonging to coset identified by Viterbi decoder 54. Parallel-to-serial converter 58 receives the cosets and label streams supplied by Viterbi decoder 54 and selector 56 in parallel. In response, parallel-to-serial converter 58 supplies these streams serially at its output terminals. As seen from the above equations, the reduced LOG-MAP decoder, in accordance with the present invention, performs $2^{(u+n)(Mt-1)}$ searches in order to identify the most likely coset and the most likely transmitted label from the identified coset.

It is understood that search-efficient Log-MAP decoder 52, in accordance with the present invention, may be implemented by software code executed by a central processing unit, by dedicated hardware or by a combination of hardware and software. The above embodiments of the present invention are illustrative and not limitative.

The invention is not limited by the number of deployed transmit or receive antennas. The invention is not limited by the number of cosets or the number of labels within each coset. For example, the present invention would also work where $M_t$ or $M_r$ falls to one or is set to one (effectively resulting in a SIMO or MISO system) or a system with $M_r$=1 at the outset, although the improvement over an exhaustive search might be less than with a MIMO system. The invention is not limited by the number of bits used to select a coset or the number of bits used to select a label from a coset. Other additions, subtractions or modifications are obvious in view of the present invention and are intended to fall within the scope of the appended claims.

What is claimed is:

1. A method for decoding symbols transmitted in a multi-input multi-output communications system having $M_t$ transmit antennas and $M_r$ receive antennas, the symbols transmitted via a channel having an associated matrix H with $M_t$ columns and $M_r$ rows, the method comprising:

receiving a vector r of the transmitted symbols on the $M_r$ receive antennas, wherein the vector r has $M_r$ components;

thereafter forming a first vector quantity $xopt_1$ associated with a first one of the transmit antennas and having elements defined by a column $h_1$ of matrix H associated with the first antenna, the remaining columns $H_{n \neq 1}$ of matrix H, and a matrix X of possible symbols transmitted on the remaining ones of the transmit antennas, wherein matrix X includes ($M_t$−1) rows and $2^{+n}$ columns, wherein each transmitted symbol is selected from $2^u$ cosets each having $2^n$ labels, wherein n and u each is an integer greater than zero;

thereafter finding a distance metric and a label metric associated with each of the remaining transmit antennas for each coset based on $xopt_1$;

thereafter forming a second vector quantity $xopt_2$ associated with a second one of the transmit antennas and having elements defined by a column $h_2$ of matrix H associated with the second antenna, the remaining columns $H_{n \neq 2}$ of matrix H, and the matrix X; and thereafter finding a distance metric and a label metric associated with the first one of the transmit antennas for each coset based on $xopt_2$.

2. The method of claim 1, wherein the first vector quantity $xopt_1$ is defined by:

$$xopt_1 = \begin{bmatrix} \dfrac{\Lambda^{-1}(h_1^* r - h_1^* H_{n \neq 1} X)}{h_1^* h_1} \end{bmatrix}$$

wherein vector $h_1$* is the complex conjugate transpose of vector $h_1$, and $\Lambda^{-1}$ is an auto-covariance matrix of any of the transmit antennas.

3. The method of claim 1, wherein the second vector quantity xopt$_2$ is defined by:

$$xopt_2 = \begin{bmatrix} \Lambda^{-1}(h_2^* r - h_2^* H_{n\neq 2} X) \\ h_2^* h_2 \end{bmatrix}$$

wherein vector h$_2$* is the complex conjugate transpose of vector h$_2$ and $\Lambda^{-1}$ is an auto-covariance matrix of any of the transmit antennas.

4. The method of claim 1, wherein for coset j, the distance metric associated with transmit antenna i is defined by:

$$d(i, j) = \min_k (r - h_1 xopt_1(k) - H_{n\neq 1} X(k))^H \Lambda^{-1} (r - h_1 xopt_1(k) - H_{n\neq 1} X(k))$$

wherein i represents one of the transmit antennas other than the first antenna, j represents one of the $2^n$ cosets, k represents one of the $2^u$ labels of coset j, H$_{n\neq 1}$ is a matrix of the columns of H except the first column of matrix H, $\Lambda^{-1}$ is an auto-covariance matrix of any of the transmit antennas, X(k) represents all rows of matrix X which have an element of coset k in their i$^{th}$ column, and xopt$_1$(k) represents those elements of vector xopt$_1$ that belong to coset k.

5. The method of claim 1, wherein for coset j, the label metric associated with transmit antenna i is defined by:

$$label(i, j) = \\ \operatorname*{argmin}_k (r - h_1 xopt_1(k) - H_{n\neq 1} X(k))^H \Lambda^{-1} (r - h_1 xopt_1(k) - H_{n\neq 1} X(k))$$

wherein i represents one of the transmit antennas other than the first antenna, j represents one of the $2^n$ cosets, k represents one of the $2^u$ labels of coset j, H$_{n\neq 1}$ is a matrix of the columns of H except the first column of matrix H, $\Lambda^{-1}$ is an auto-covariance matrix of any of the transmit antennas, X(k) represents all rows of matrix X which have an element of coset k in their i$^{th}$ column, and xopt$_1$(k) represents those elements of vector xopt$_1$ that belong to coset k.

6. The method of claim 1, wherein for coset j, the distance metric associated with the first one of the transmit antennas is defined by:

$$d(1, j) = \min_k (r - h_2 xopt_2(k) - H_{n\neq 2} X(k))^H \Lambda^{-1} (r - h_2 xopt_2(k) - H_{n\neq 2} X(k))$$

wherein j represents one of the $2^n$ cosets, k represents one of the $2^u$ labels of coset j, h$_2$ is the second column of matrix H, H$_{n\neq 2}$ is a matrix of the columns of H except the second column of matrix H, $\Lambda^{-1}$ is an auto-covariance matrix of any of the transmit antennas, and X(k) represents all rows of matrix X which have an element of coset k in their 1$^{st}$ column.

7. The method of claim 1, wherein for coset j, the label metric associated with the first one of the transmit antennas is defined by:

$$label(1, j) = \\ \operatorname*{argmin}_k (r - h_2 xopt_2(k) - H_{n\neq 2} X(k))^H \Lambda^{-1} (r - h_2 xopt_2(k) - H_{n\neq 2} X(k))$$

wherein j represents one of the $2^n$ cosets, k represents one of the $2^u$ labels of coset j, h$_2$ is the second column of matrix H, H$_{n\neq 2}$ is a matrix of the columns of H except the second column of matrix H, $\Lambda^{-1}$ is an auto-covariance matrix of any of the transmit antennas, and X(k) represents all rows of matrix X which have an element of coset k in their 1$^{st}$ column.

8. The method of claim 7, further comprising:
applying the distance metric and the label metric associated with each transmit antenna to a Viterbi decoder.

9. The method of claim 8, further comprising:
applying the distance metric and the label metric associated with the first transmit antenna to each of the i$^{th}$ to M$_t$$^{th}$ transitions in the trellis, wherein i is an integer varying from 0 to (M$_t$−1).

10. A decoder adapted to receive a vector r of symbols transmitted in a multi-input multi-output communications system having M$_t$ transmit antennas and M$_r$ receive antennas, said decoder further adapted to receive a channel matrix H having M$_t$ columns and M$_r$ rows and through which the symbols are transmitted, wherein the vector r has M$_r$ components, the decoder comprising:

a first module adapted to form a first vector quantity xopt$_1$ associated with a first one of the transmit antennas and having elements defined by a column h$_1$ of matrix H associated with the first antenna, the remaining columns H$_{n\neq 1}$ of matrix H, and a matrix X of possible symbols transmitted on the remaining ones of the transmit antennas, wherein matrix X includes (M$_t$−1) rows and $2^{u+n}$ columns, wherein each transmitted symbol is selected from $2^n$ cosets each having $2^u$ labels, wherein n and u each is an integer greater than zero;

a second module adapted to compute a distance metric and a label metric associated with each of the remaining transmit antennas for each coset based on xopt$_1$;

a third module adapted to form a second vector quantity xopt$_2$ associated with a second one of the transmit antennas and having elements defined by a column h$_2$ of matrix H associated with the second antenna, the remaining columns H$_{n\neq 2}$ of matrix H, and the matrix X; and a fourth module adapted to compute a distance metric and a label metric associated with the first one of the transmit antennas for each coset based on xopt$_2$.

11. The decoder of claim 10, wherein said first vector quantity xopt$_1$ formed by said first module is defined by:

$$xopt_1 = \begin{bmatrix} \Lambda^{-1}(h_1^* r - h_1^* H_{n\neq 1} X) \\ h_1^* h_1 \end{bmatrix}$$

wherein vector h$_1$* is the complex conjugate transpose of vector h$_1$, and $\Lambda^{-1}$ is an auto-covariance matrix of any of the transmit antennas.

12. The decoder of claim 10, wherein said second vector quantity $xopt_2$ formed by said third module is defined by:

$$xopt_2 = \left[\frac{\Lambda^{-1}(h_2^* r - h_2^* H_{n\neq 2} X)}{h_2^* h_2}\right]$$

wherein vector $h_2^*$ is the complex conjugate transpose of vector $h_2$ and $\Lambda^{-1}$ is an auto-covariance matrix of any of the transmit antennas.

13. The decoder of claim 10, wherein for coset j, the distance metric computed by the second module and associated with transmit antenna i is defined by:

$$d(i, j) = \min_k (r - h_1 xopt_1(k) - H_{n\neq 1} X(k))^H \Lambda^{-1} (r - h_1 xopt_1(k) - H_{n\neq 1} X(k))$$

wherein i represents one of the transmit antennas other than the first antenna, j represents one of the $2^n$ cosets, k represents one of the $2^u$ labels of coset j, $H_{n\neq 1}$ is a matrix of the columns of H except the first column of matrix H, $\Lambda^{-1}$ is an auto-covariance matrix of any of the transmit antennas, X(k) represents all rows of matrix X which have an element of coset k in their $i^{th}$ column, and $xopt_1(k)$ represents those elements of vector $xopt_1$ that belong to coset k.

14. The decoder of claim 10, wherein for coset j, the label metric computed by the second module and associated with transmit antenna i is defined by:

$$\text{label}(i, j) = \operatorname*{argmin}_k (r - h_1 xopt_1(k) - H_{n\neq 1} X(k))^H \Lambda^{-1} (r - h_1 xopt_1(k) - H_{n\neq 1} X(k))$$

wherein i represents one of the transmit antennas other than the first antenna, j represents one of the $2^n$ cosets, k represents one of the $2^u$ labels of coset j, $H_{n\neq 1}$ is a matrix of the columns of H except the first column of matrix H, $\Lambda^{-1}$ is an auto-covariance matrix of any of the transmit antennas, X(k) represents all rows of matrix X which have an element of coset k in their $i^{th}$ column, and $xopt_1(k)$ represents those elements of vector $xopt_1$ that belong to coset k.

15. The decoder of claim 10, wherein for coset j, the distance metric computed by the fourth module and associated with the first one of the transmit antennas is defined by:

$$d(1, j) = \min_k (r - h_2 xopt_2(k) - H_{n\neq 2} X(k))^H \Lambda^{-1} (r - h_2 xopt_2(k) - H_{n\neq 2} X(k))$$

wherein j represents one of the $2^n$ cosets, k represents one of the $2^u$ labels of coset j, $h_2$ is the second column of matrix H, $H_{n\neq 2}$ is a matrix of the columns of H except the second column of matrix H, $\Lambda^{-1}$ is an auto-covariance matrix of any of the transmit antennas, and X(k) represents all rows of matrix X which have an element of coset k in their $1^{st}$ column.

16. The decoder of claim 12, wherein for coset j, the label computed by the fourth module and associated with the first one of the transmit antenna is defined by:

$$\text{label}(1, j) = \operatorname*{argmin}_k (r - h_2 xopt_2(k) - H_{n\neq 2} X(k))^H \Lambda^{-1} (r - h_2 xopt_2(k) - H_{n\neq 2} X(k))$$

wherein j represents one of the $2^n$ cosets, k represents one of the $2^u$ labels of coset j, $h_2$ is the second column of matrix H, $H_{n\neq 2}$ is a matrix of the columns of H except the second column of matrix H, $\Lambda^{-1}$ is an auto-covariance matrix of any of the transmit antennas, and X(k) represents all rows of matrix X which have an element of coset k in their $1^{st}$ column.

17. The decoder of claim 16, wherein said decoder supplies the distance metric and the label metric associated with each transmit antenna to a Viterbi decoder.

18. The decoder of claim 10, wherein each of the first, second, third and fourth modules is a software module.

19. The decoder of claim 10, wherein each of the first, second, third and fourth modules is a hardware module.

20. The decoder of claim 10, wherein each of the first, second, third and fourth modules includes both software and hardware modules.

* * * * *